United States Patent [19]
Morse et al.

[11] Patent Number: 4,831,397
[45] Date of Patent: May 16, 1989

[54] PHOTOGRAPHIC APPARATUS FOR TRANSMISSION ELECTRON MICROSCOPES

[75] Inventors: John B. Morse, Boston; Joseph A. Stella, Peabody, both of Mass.

[73] Assignee: Polaroid Corporation, Cambridge, Mass.

[21] Appl. No.: 208,674

[22] Filed: Jun. 20, 1988

Related U.S. Application Data

[62] Division of Ser. No. 127,485, Dec. 1, 1987, Pat. No. 4,779,113, which is a division of Ser. No. 922,259, Oct. 23, 1986, Pat. No. 4,742,216.

[51] Int. Cl.⁴ ............................................. G03B 17/26
[52] U.S. Cl. .................................... 354/212; 271/19; 250/311
[58] Field of Search ............... 354/174, 212, 276, 277, 354/178, 180, 181, 182, 304, 319; 271/188, 209, 19, 20, 21, 22, 23, 24, 25; 378/172, 173, 174, 181, 182, 183, 184, 185, 186, 187, 188

[56] References Cited

U.S. PATENT DOCUMENTS

| | | | |
|---|---|---|---|
| 2,247,257 | 6/1941 | Shelton | 354/283 |
| 3,627,307 | 12/1971 | Does | 271/19 |
| 3,784,834 | 1/1974 | Berger | 378/174 |
| 3,804,625 | 4/1974 | Sorli | 354/276 |
| 4,160,545 | 7/1979 | Spence-Bate | 354/276 |
| 4,258,263 | 3/1981 | Buldini et al. | 354/276 |
| 4,281,829 | 8/1981 | Thomas | 271/19 |
| 4,303,327 | 12/1981 | Labella | 354/276 |
| 4,388,992 | 6/1983 | Deconinck | 354/283 |
| 4,664,492 | 5/1987 | Stella | 354/212 |

*Primary Examiner*—A. A. Mathews
*Attorney, Agent, or Firm*—David R. Thornton

[57] ABSTRACT

A photographic apparatus for providing an instant film system for transmission electron microscopes includes a film carrier and film unit handling apparatus compatable with existing TEM equipment. Film carrier plates, each standardized to accept an instant film sheet and to subsequently enable automatic separation of the latter, are varied in exterior configuration to conform to each type of TEM unit, and a single processor is provided for handling film processing with carrier plates utilized in any of the TEM units. The carrier plates are standardized to enable automated separation of individual exposed film sheets from the respective carrier plates in the processor, and a transfer base or transfer box is provided to cooperate with the receiver box of a given TEM design and with the processor which includes a reciprocating slide feed mechanism by which each individual film unit is ejected from the box. The processor then separates the film sheet from the carrier plate, assembles it with processing materials and advances it to the nip of a processing roller pair.

1 Claim, 9 Drawing Sheets

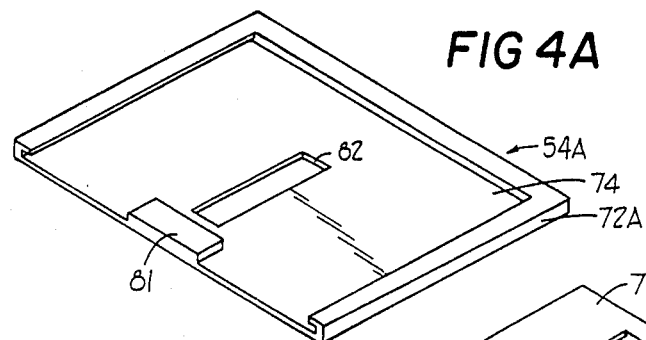
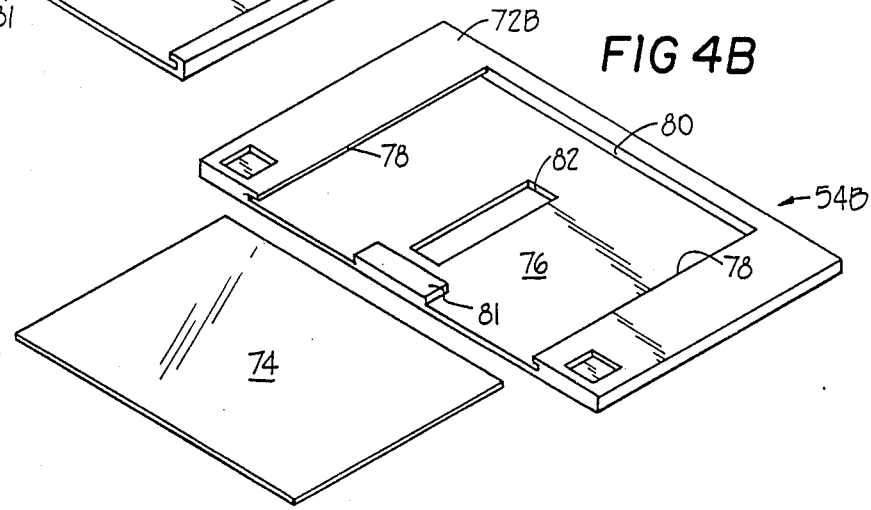
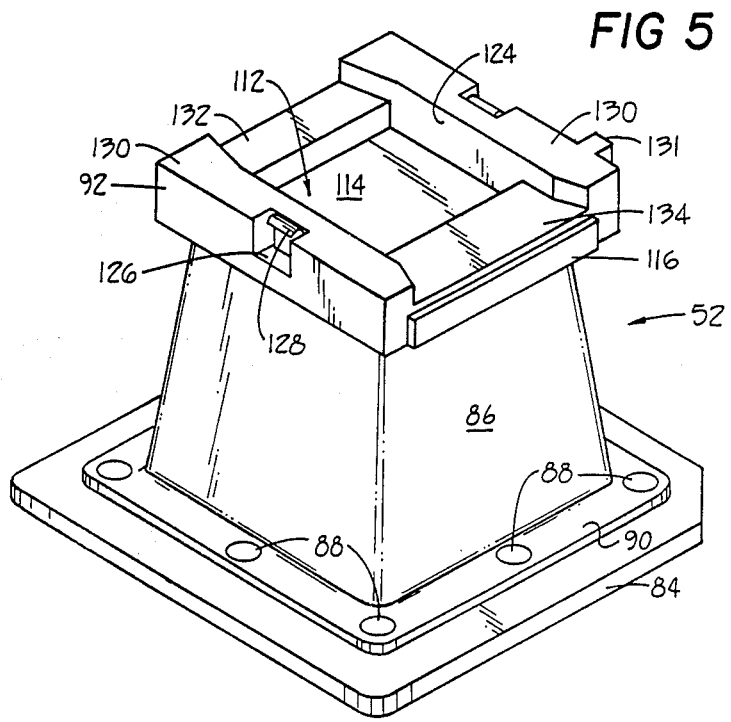

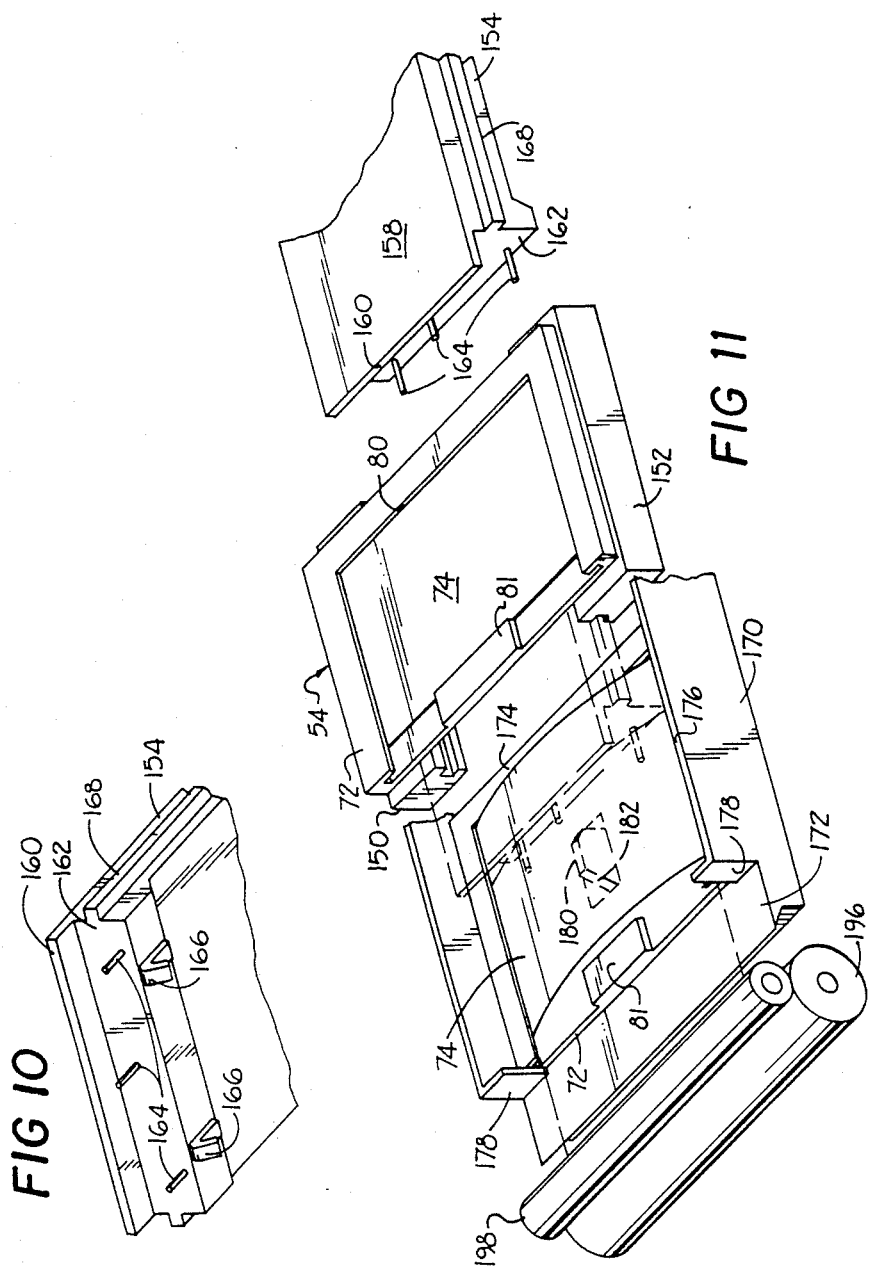

PHOTOGRAPHIC APPARATUS FOR TRANSMISSION ELECTRON MICROSCOPES

This is a division of application Ser. No. 127,485, filed Dec. 1, 1987, now U.S. Pat. No. 4,779,113, which is, in turn, a division of application Ser. No. 922,259, filed Oct. 23, 1986, now U.S. Pat. No. 4,742,216.

BACKGROUND OF THE INVENTION

This invention relates to photographic apparatus for use with transmission electron microscopes (TEM). More particularly, it concerns such apparatus which is adaptable to presently existing TEM machinery designs without modification of that machinery and which makes possible TEM exposure and immediate processing of instant film exemplified by diffusion transfer film emulsions and related processing chemistry.

TEM machines are capable of providing an image of a specimen with a magnification factor of up to one million times and are used extensively in such fields as pathology, biology, chemistry, metallurgy and other industrial applications for visible observation of such magnified images. Although the magnified electron image may be observed directly when focused on a fluorescent screen or by using other forms of electronic imaging devices, the resolution of detail in such directly observable images is much lower than the resolving capacity of photographic emulsions. For this reason, as well as for providing permanent records of TEM magnified images of specimens, TEM machines are conventionally equipped with photographic film exposing systems to enable visual observation of high resolution detail in the magnified specimen image. Moreover, final analyses of a given specimen is usually delayed until one or more photographs of the TEM image are available for observation.

TEM machines are extremely expensive, currently priced in the hundreds of thousands of U.S. dollars, and as such, each machine represents a major investment to a research laboratory. In addition to costly, high power electron beam generating and focusing components, the space or chamber in which the electrons are transmitted must be evacuated to $10^{-7}$ atmospheric pressure or more in order to avoid electron scattering by collision with molecules of air or with molecules of other substances in a gaseous phase. In this latter respect, it is to be noted that all normally liquid and any normally solid substances will vaporize under the magnitude of vacuums developed in the electron chamber of TEM machines. Because the film and film handling accessories of a TEM photographic system are presented in the evacuated electron beam chamber and, moreover, are passed into and out of that chamber, each TEM machine involves costly vacuum sealing mechanisms predicated in substantial part on the physical format of film unit assemblies employed and on the configuration of film containers or boxes to be used in a TEM machine of a given design. Hence, modification of photographic components in presently existing TEM equipment is impractical and, moreover, design changes in photographic apparatus supplied by manufacturers of TEM machines are restricted to accommodation of respective TEM machine designs.

To provide a general understanding of existing TEM machine design and the procedures required in the handling of photographic film to be used in such machines, reference is made to FIGS. 1 and 2 of the accompanying drawings. In FIG. 1, the various photographic equipment and handling procedures in a conventional research laboratory are schematically represented. In FIG. 2, the transfer of individual film units within the TEM machine is diagrammatically depicted.

In FIG. 1, a TEM machine 10 is shown to include a cabinet-like base 12 on which is mounted an electron beam focusing column 14 having a specimen receptor 16 and carrying an electron beam generating head 18 at its upper end. An observation port 20 is customarily provided for viewing a fluorescent plate (not shown) at the base of the column. The cabinet 12 includes a pair of drawers 22 and 24 for receiving respectively a film supply box 26 and a film receiver box 28. In FIG. 2, the film boxes 22 and 24 are shown as they might be oriented within the TEM machine 10 which includes mechanisms (not shown) for transferring individual film units 30 from the supply box 26 to an exposure station aligned with the focusing column 14 and then to the receiver box 28. The evacuated chamber of the TEM machine 10 is generally depicted in phantom lines in FIG. 2 and as such encloses both boxes 26 and 28 within the machine 10.

The film handling procedure now used in TEM laboratories is diagrammatically depicted in FIG. 1 of the drawings. Individual film sheets 32 are removed from a shipping carton 34, manually inserted into a machine compatible carrier plate 36 to provide a film unit 30. The film units 30 are then loaded into a supply box 26 to complete a film preparation procedure carried out in total darkness within a darkroom 38. In larger TEM laboratories, as many as 8 or more TEM machines 10 may be serviced by a single darkroom. Also, it is not uncommon for a laboratory to employ the TEM machines of two or more different manufacturers, each of which requires a unique carrier plate 36, supply box 26 and receiver box 28. Both boxes 26 and 28 employ light-tight cover or "dark slide", the dark slide 40 of the supply box 26 being closed in the darkroom 38 after it is filled with film units 30.

Prior to use in a TEM machine 10, the loaded supply boxes 26 must be out-gassed in a vacuum chamber 42 for at least 12 hours to assure removal of volatile substances which may vaporize in the vacuum chamber of the TEM machine. As explained above with reference to FIG. 2, in the TEM machine 10, a specimen is inserted into the column 14 and photographed by passing the individual film units 30 from the supply box 26 to an exposure station and then to the receiver box 28. It is desirable with some types of specimens to expose only a few film units 30 and then remove the receiver box 28 (with only the few exposed film units) and return it to the darkroom for development so that the developed images may be observed prior to making further exposures of electron images of the same specimen. In fields such as pathology or where other biological specimens are under observation, the time required for conventional film handling development is often longer than the viable life of the specimen. Hence, it is customary to await development of film until the receiver box 28 is filled.

From the foregoing, it will be appreciated that in the present use of TEM machinery, the attainment of a high resolution photograph of a specimen is a very tedious and time consuming procedure by which the benefits of specimen analysis are significantly delayed. This is particularly true in the field of pathological analysis of tissue removed by surgery or in similar fields where it would be desirable to have the benefit of a TEM photograph available within a short period of time.

SUMMARY OF THE INVENTION

In accordance with the present invention, a photographic system is made available for existing TEM machinery by which diffusion transfer or other instant film emulsions may be exposed to the magnified TEM image and processed immediately thereafter in daylight. The system employs a combination of film sheet carrier plates and film unit handling apparatus which is adaptable to all known TEM machinery and by which exposed film sheets may be processed automatically in a single film processor.

The film sheet carrier plates of the invention are of an exterior configuration duplicating existing carrier plates of diverse TEM designs to enable unimpaired use thereof in existing machines. The film sheet retaining structure of the carrier plates, however, is standardized to enable automated separation of individual exposed film sheets from the respective carrier plates in the processor.

The diverse designs of receiver boxes used with existing TEM machines are retained by the provision of a transfer box equipped with an adaptor base shaped to cooperate with the receiver box of a given existing design and to cooperate with a film unit feed mechanism in the processor. While the use of a transfer box minimizes handling of the TEM receiver box and is thus preferred, it is contemplated that the receiver boxes of the several existing designs may be provided with an adaptor top to enable direct placement of the receiver box into the film processor.

The film processor is a compact self-contained unit having an exterior console or cabinet-like enclosure and is capable of placement next to a TEM machine or centrally in relation to several such machines. The processor is designed to receive and cooperate with the transfer box in a manner to enable complete film processing. Once in the processor, the opened base of the transfer box is positioned in operative relation to a reciprocating slide feed mechanism by which each individual film unit is ejected from the box, the film sheet separated from the carrier plate, assembled with processing materials and advanced to the nip of a processing roller pair. Retraction of the slide feed mechanism deposits the empty carrier plate in a receptacle for removal and subsequent reuse. Processing supplies in the processor are preferably in web form to facilitate continuous feed from supply spools to a take-up spool. Each individual film sheet is separated from the processing webs to be available at an access door in the processor cabinet.

Among the objects of the present invention are, therefore, the provision of a photographic system enabling the use of instant film in existing TEM machinery; the provision of such a system which requires no modification to the existing TEM machinery; the provision of such a system which is adaptable to diverse types of TEM machinery without modification thereof; and the provision of such a system which reduces significantly the time and handling requirements of existing TEM photographic systems. Other objects and further scope of applicability of the present invention will become apparent from the detailed description to follow taken in conjunction with the accompanying drawings in which like reference numerals designate like parts.

BRIEF DESCRIPTION OF THE DRAWINGS

FIGS. 4A and 4B are perspective views illustrating alternate forms of film units usable with different designs of existing TEM machinery;

FIG. 5 is a perspective view illustrating a transfer box in accordance with the present invention;

FIG. 10 is a fragmentary perspective view illustrating the bottom front of a feed slide in the processor of FIGS. 8 and 9;

FIG. 11 is an exploded perspective view illustrating the operation of the feed mechanism shown in FIG. 10;

DETAILED DESCRIPTION OF THE PREFERRED EMBODIMENT

Figure 3:
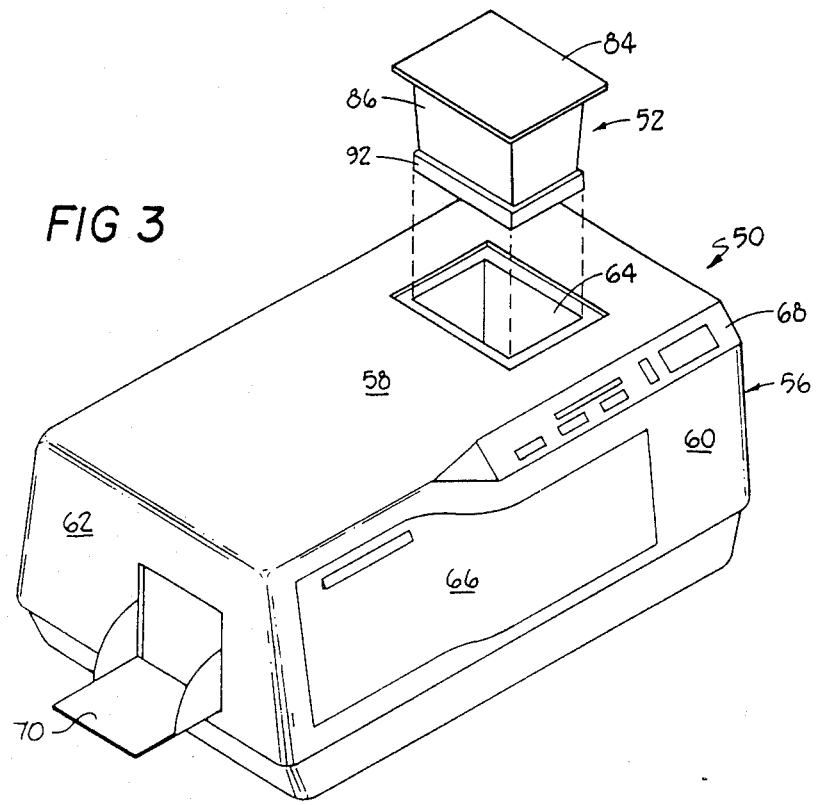
FIG. 3 is an exploded perspective view illustrating the processor and transfer box of the present invention.

In FIGS. 3-5 of the drawings, the exterior conformation of components employed in an embodiment of the present invention are illustrated generally and include a processor 50 (FIG. 3), a transfer box 52 (FIGS. 3 and 5) and film units 54A and 54B (FIGS. 4A and 4B). In the illustration of FIG. 3, the processor 50 is shown as having an exterior console 56 defining a lighttight enclosure 56 having top, front and end walls 58, 60 and 62, respectively. The top wall 58 includes a well 64 for receiving the transfer box 52 or its equivalent, whereas the front wall 60 is provided with a door 66 through which processing supplies to be described may be inserted and the spent processing supplies removed. A control panel 68 is provided between the top and front walls 58 and 60 and a bin-type discharge door 70 is located in the end wall 62. While internal operating components of the processor 50 will be described in more detail in the description to follow, it will be appreciated from the illustration in FIG. 3 that the processor represents a component capable of being positioned for easy access in the vicinity of a TEM machine.

The film units 54A and 54B, illustrated in FIGS. 4A and 4B of the drawings, are intended to represent two of several film unit configurations required for effective use in existing TEM machines supplied by different manufacturers. While all such units are similar to the point of including a plate-like carrier 72 on which a film sheet 74 may be mounted and retained during use of the film unit in a TEM machine, the exterior dimensions and physical configuration beyond that needed to retain the film sheet 74 in place is dictated by existing equipment. In particular, the thickness and peripheral dimensions of the carriers 72, though different in the units 54A and 54B, are determined principally by the exposing station and transfer mechanism of TEM machines of specific manufacturing design and the dimensions of the supply and receiver boxes used therewith. Thus, the carrier 72A of the unit 54A is smaller peripherally than the carrier 72B of the unit 54B and each carrier may have different surface formations required to accommodate the transfer mechanism, for example, in the TEM machine of a particular manufacturer. In accordance with the present invention, both carrier plates 72A and 72B are identical in their definition of a film sheet retention slip. In particular, the retention slip of each carrier plate includes a depressed planar floor 76 having undercut lips 78 at opposite ends and terminating in a film stop member such as rear wall 80. A central boss-like formation 81 near the front edge of the floor 76 serves to retain the film sheet 74 against fore and aft movement once it is inserted onto the floor 76 and under the lips 78. Also, both carriers include a rectangular aperture 82 positioned centrally of the floor 76 for reasons which will become apparent from the detailed description to follow.

The film sheets 74 carry an electron beam responsive emulsion on their top surface as well as chemistry incident to diffusion transfer processing of an image to which the top of the film sheet has been exposed. As is well known in the diffusion transfer photographic art, the sheets may be designed to present a positive reflective image upon processing or may be designed to present a negative transparency of the image to which the sheet is exposed. Because research laboratories employing TEM machines favor negative transparencies, the film sheets 74 are preferably of that type.

Figure 6:
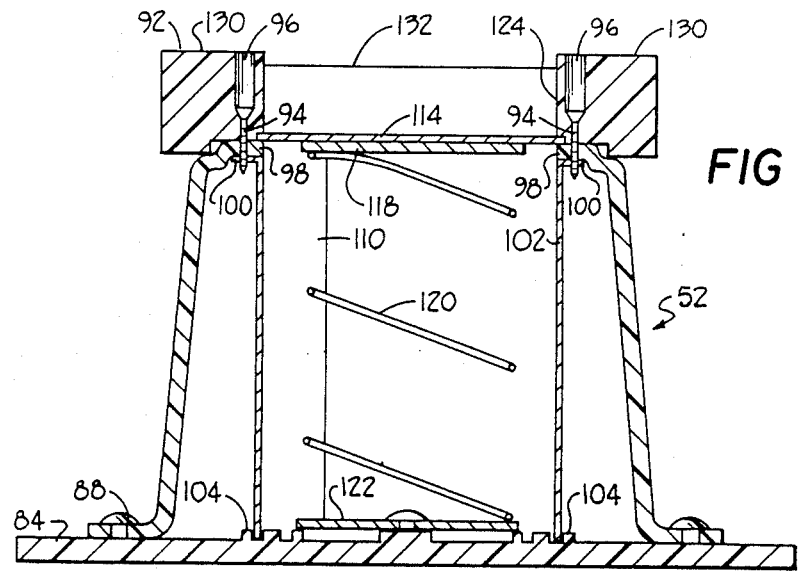
FIG. 6 is a section through the transfer box of FIG. 5.
Figure 7:
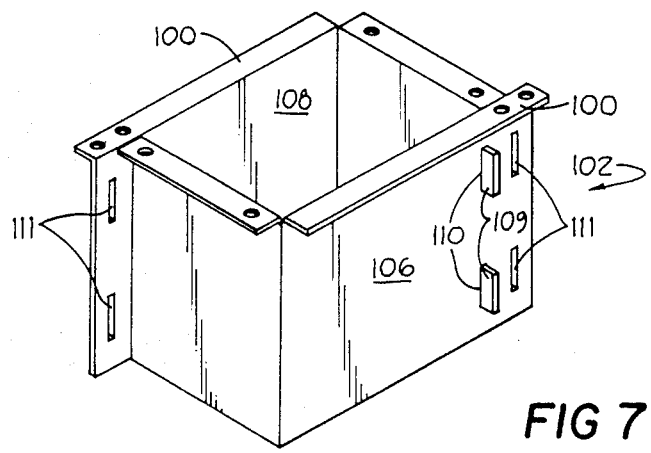
FIG. 7 is a perspective view illustrating a preferred film unit liner assembly for the transfer box of FIG. 5.

The construction of the transfer box 52 is shown most clearly in FIGS. 5-7 of the drawings to include an plate-like cover 84 to which an exterior, lighttight box 86 is secured. The cover 84 is preferably formed by injection molding of plastic material and the box 86 by blow molding the same or a similar plastic to enable securement of these two parts by rivet-like stakes 88 in the cover projecting through apertures in an outwardly extending flange 90 at one end of the box 86. An injection molded adaptor 92 is affixed or secured, as by screws 94 (FIG. 6) to the end of the box 86 opposite from the cover 84. As best shown in FIG. 6, the screws 94 extend from within countersink bores 96 in the adaptor 92, through an inwardly directed flange 98 in the exterior box 86 and through an underlying outwardly directed flange 100 of an interior box liner 102. The screws 94 thus secure the assembly of the adaptor 92 to the exterior box 86 and as well, secure the upper end of the liner 102 in place relative to the end of the exterior box 86 opposite from the cover plate 84. The end of the liner 102 adjacent to the cover plate 84 is secured in place by rail-defined grooves 104 on the inside of the cover plate 84, alternate grooves 104 being provided for reasons which will be apparent from the construction of the liner box 102 as shown in FIG. 7. Specifically, the liner box 102 is formed from two sheet metal parts 106 and 108, each forming a side and end wall of the rectangular liner box configuration. The end wall portion of each of the sheet metal components 106 and 108 ends in a pair of tab members 109 which are configured for extending through one pair of a dual pair of apertures 110 and 111. In this way, the same components may be used to provide liners 102 of different longitudinal dimensions to accommodate the peripheral dimensions of various forms of the carrier plates 72A and 72B as described above with respect to FIGS. 4A and 4B of the drawings. Also in this connection, the provision of alternate grooves 104 in the interior of the cover plate 84 enables a common cover plate to be used for different sizes of liners 102.

Additionally included in the transfer box 52 is a dark slide 112 having a planar sheet-like light shielding portion 114 of a size to completely close the opening defined by the inwardly directed flange 98 on the exterior box 86 and a right angle handle flange 116 (see FIG. 5) to facilitate sliding the dark slide 112 from a closed position, as shown in FIG. 5, to an open position in which the body portion 114 thereof is withdrawn clear of the opening defined by the inwardly directed flange 98 in the exterior box component 86. The transfer box 52 further includes a follower plate 118 (FIG. 6) biased by a relatively weak compression spring 120 extending between the follower plate 118 and a mounting plate 122 staked centrally to the interior of the cover plate 84. The spring 120 is similar to the spring found in the receiver boxes 28 of existing machines.

The configuration of the adaptor 92, together with the dimensions of the liner 102, will relate a specific transfer box 52 to the TEM machine of a particular manufacturer both from the standpoint of accommodating dimensional peculiarities of film units used in that TEM machine and from the standpoint of cooperating with the receiver box 28 used in the same machine. On the other hand, all such adaptors 92 are designed to cooperate with the processor 50 in a manner to be described. Each adaptor 92, therefore, is in the nature of a frame-like member having a generally central rectangular opening 124 which, as may be seen in FIG. 6, represents a continuation of inner surfaces defined by the liner 102. As such, the size of the opening 124 in different adaptors will vary to accommodate the film units of different TEM machines. In these adaptors 92, however the opening 124 will be capable of providing a lighttight closure by means of the dark slide 112.

Although the details of various receiver boxes 28 used in existing TEM machines of diverse manufacturers are not shown in the drawings, the existing receiver boxes 28 conventionally employ specific arrangements by which they are mounted in the TEM machine for which they were designed. The adaptor 92 intended for use with the receiver boxes 28 of a specific TEM machine is provided with specific formations, such as the recesses 126 and/or clips or hooks 128 (FIG. 5), the latter explained in detail with regard to hooks 242 in FIG. 14, to enable a lighttight connection to the receiver box 28. All adaptors 92 are also formed with bearing surfaces 130 on opposite sides of recessed surfaces 132 and 134 for cooperation with the processor 50.

In the transfer of film units from a receiver box 28 of an existing TEM machine to a transfer box 52 equipped with an adaptor 92 designed to cooperate with that receiver box 28, the receiver box 28 is inverted and placed against the adaptor 92 while the transfer box is in the position illustrated in FIGS. 5 and 6 of the drawings for example. The dark slide 112 of the transfer box and also the dark slide of the receiver box are opened so that the film units drop directly through the opening 124 in the adaptor 92 and into the liner 102 of the transfer box 52. Thereafter, the dark slide 112 is closed and the transfer box is disengaged from the receiver box with the film units contained in the transfer box and protected from light.

After loading the transfer box 52 with one or more exposed film units 54, the transfer box 52 is inverted and inserted into the well 64 of the processor 50 as depicted in FIG. 3. To insure proper orientation, a keying lug 131 is carried by the adaptor 92 (see FIG. 5) and configured for cooperation with a key slot (not shown) in the processor 50. When the transfer box 52 is so inserted, the film units 54 in the box are oriented with the film sheet 74 facing up and with the rear wall 80 of each carrier plate 72 disposed toward the rear of the well adjoining the ejector slide 154. In the processor 50, as later explained in detail with regard to FIGS. 8–13, the film sheet 74 of each film unit 54 is separated from the carrier plate 72 on which it was mounted originally, processed, and the processed film sheet delivered to the bin 70 for access. This series of operations is effected by working components within the processor 50 and which may be understood by reference to FIGS. 8–13 of the drawings.

Figure 8:
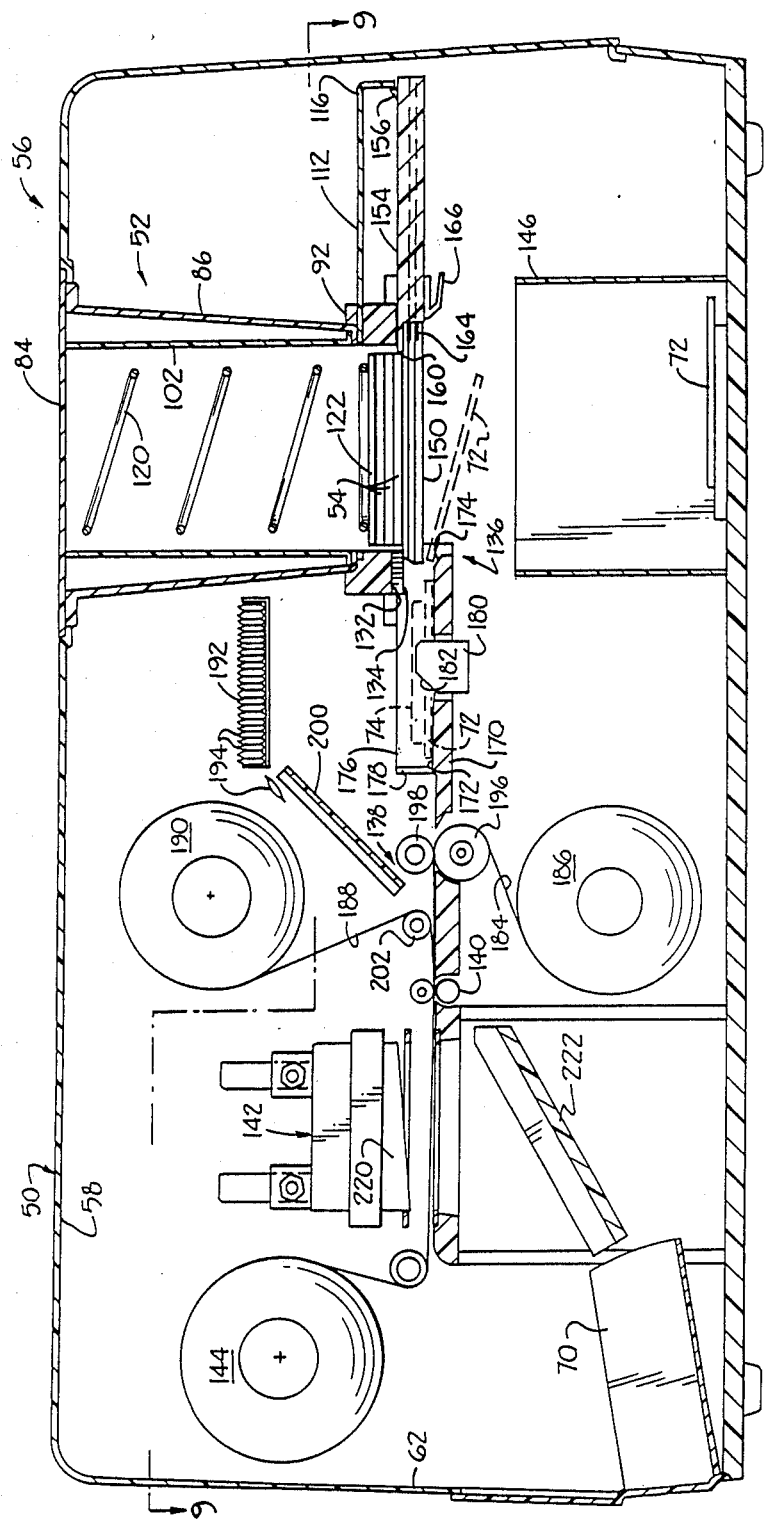
FIG. 8 is a longitudinal cross-section illustrating the interior of the processor shown in FIG. 3.
Figure 9:
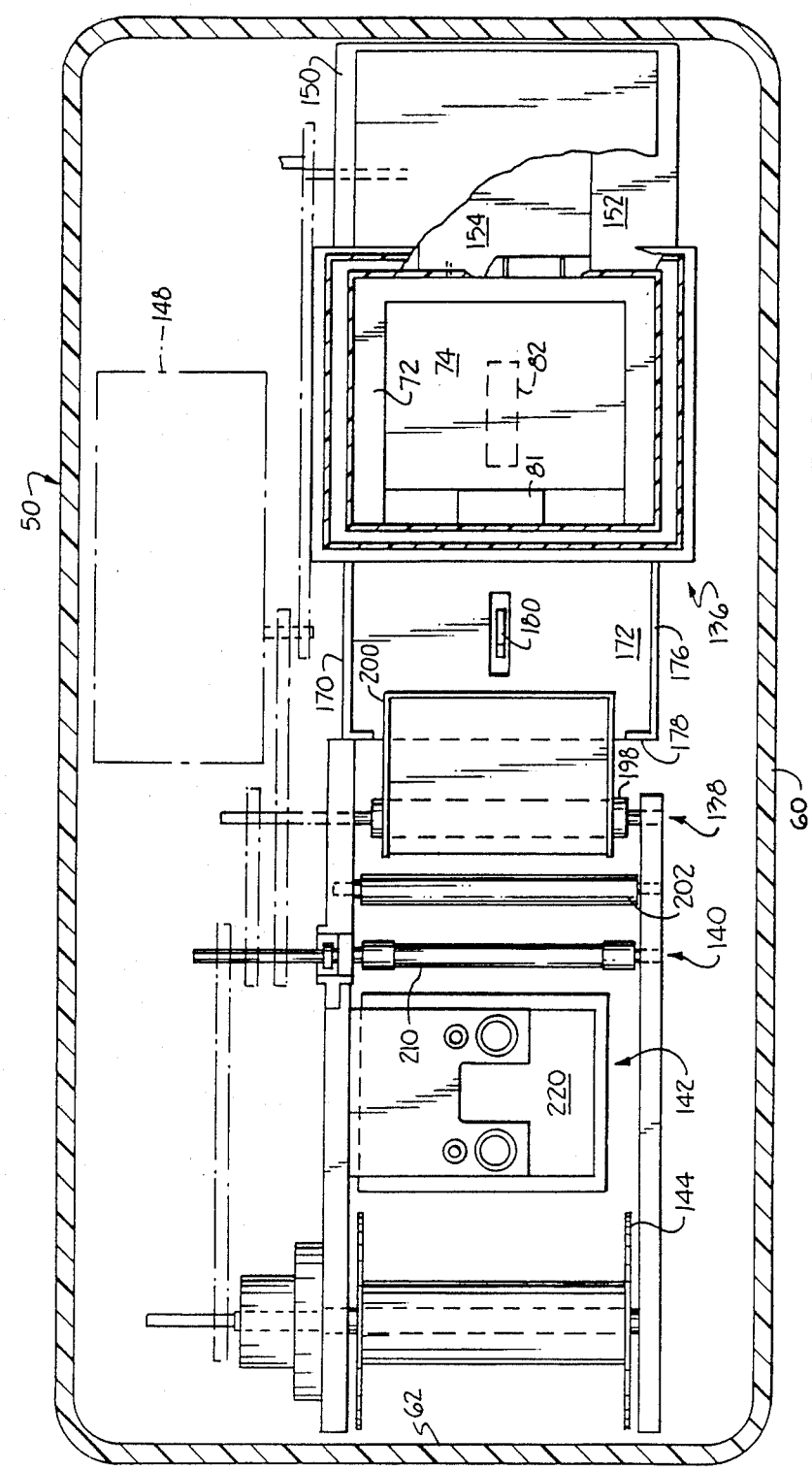
FIG. 9 is a cross-section generally on line 9—9 of FIG. 8.

In FIGS. 8 and 9, the general organization of internal processor components is shown to include, in the illustrated embodiment, a film sheet feed mechanism generally designated by the reference numeral 136, a processing assembly mechanism 138, a processing roller pair 140, a composite blanking mechanism 142, a spent processing material storage reel 144 and a spent carrier plate bin 146. The movable ones of such components are operated under power supplied by a motor 148 (FIG. 9) and synchronized in a manner to carry out the successive film processing procedures in a manner to be described.

The film sheet feed mechanism 136 is positioned generally at the base of the transfer box well 64 and thus under the adaptor 92 of a transfer box 52 loaded into the processor 50. When positioned in the well 64, the bearing surfaces 130 on opposite sides of the adaptor 92 engage the top of a pair of rails 150 and 152 which additionally function as guideways for a reciprocable ejector slide 154. When the transfer box 52 is initially loaded into the well 64, the ejector slide 154 is positioned to underlie the trailing recessed surface 134 in the adaptor 92 of the transfer box. A tang 156 or its equivalent on the ejector slide 154 will thus be positioned to engage the handle flange 116 of the dark slide 112 in the transfer box 52. Rearward movement of the ejector slide to the position illustrated in FIG. 8, for example, will effect movement of the dark slide 112 to its opened position as shown. Also, the lowermost of the film units 54 will drop down against the top of the rails 150 and 152 to position that unit at the plane of the recessed flat 134 of the adaptor 92.

As shown most clearly in FIGS. 10 and 11 of the drawings, the ejector slide 154 is formed with a planar top surface 158 terminating at its front end as a projecting abutment ledge 160. In a vertical surface 162 offset rearwardly from the ledge 160, a plurality, specifically three, projecting pins 164 are mounted. The pins are oriented at the corners of a flat isosceles triangle or so that the space between the pins 164 establishes a generally arcuate path. At the bottom of the ejector slide 154 adjacent the vertical surface 162, a pair of hook members 166 are secured. As above-mentioned, the ejector slide is supported for reciprocal motion by the guiderails 150 and 152, and to this end, opposite sides of the ejector slide 154 are provided with tenons 168 or equivalent to enable such sliding support.

Positioned forwardly of the rails 150 and 152 is a film unit platform 170 having a top surface 172 which lies in a horizontal plane spaced beneath the bottom front ends of the rails 150 and 152 and which terminates at its rear end in a chamfer 174 to establish a gap with the lower front ends of the rails 150 and 152 slightly larger than the thickness of a carrier plate 72. The top surface 172 of the platform 170 is partially circumscribed by side walls 176 and short front wall portions 178 spaced from each other by a distance at least as long as the major dimension of the film sheets 74. Projecting through the top surface 172 of the platform 170 at the approximate center thereof is a nose member 180 having a ramp-like formation 182 at the front edge thereof. As may be seen in FIG. 8, the top of the nose member 180 extends appreciably above the plane of the platform top surface 172 whereas the ramp formation 182 begins at a level below the surface 172 at its forward-most point.

In light of the described organization of the film sheet feed mechanism, forward movement of the ejector slide 154 from the position shown in FIG. 8, for example, will advance the bottom film unit 54 in the transfer box 52 forwardly on the rails 150 and 152, under the recessed surface 132 of the adaptor 92 and onto the platform 170. Because of the depressed elevation of the platform 170, the forwardly moved film unit 54 will drop onto the top surface 172 of the platform 170 and be positioned generally by the side walls 176 and front wall portions 178. As a result of the central aperture 82 in each of the carrier plates 72 used in the film units of the present invention, the nose member 180 will project through the aperture 82 and against the bottom side of the film sheet 74 retained by the carrier plate 72. This action creates an arc-like configuration in the film sheet 74 so that the rear edge of the film sheet will project above the forwardly facing vertical wall 80 of the film retaining slip in the carrier plate 72 and so that the front edge of the film sheet 74 will be elevated clear of the boss-like formation 81 on the same carrier plate. Also, the arcuate configuration of the film sheet 74 will impart rigidity to the sheet in a fore/aft direction. Continued forward movement of the ejector slide 154 will operate to pass over the rear edge of the film so that the arcuate formation at the rear edge of the film unit 74 is engaged and contained by the projecting pins 164 on the ejector slide 154. As a result, the continued forward motion of the slide 154 will advance the film sheet 74 out of the carrier plate 72 toward the processing assembly mechanism 138. Upon full forward movement of the ejector slide 154, an edge of the emptied carrier plate 72 will be engaged by the hooks 166 on the ejector slide 154 so that upon return or rearward movement of the slide 154, the spent carrier plate (shown in dotted outline in FIG. 8) will pass through the gap between the top surface 172 of the platform 170 under the rails 150 and 152 and into the spent carrier bin 146.

As shown in FIG. 8, processing materials contained within the processor 50 in the illustrated embodiment of the invention include a transport web 184 supplied on a reel 186, a transparent cover web 188 supplied on a reel 190 and a tray 192 containing a supply of processing fluid pods 194. These processing materials are brought together into operative relationship with the film sheet 74 at the processing assembly mechanism 138 after discharge of the film sheet 74 from the film sheet feed mechanism 136 in the manner described above. The transport web 184 is preferably a continuous web of paper or comparable sheet material coated on one surface with a non-permanent adhesive. In the reel 186 as shown in FIG. 8, the adhesive would be coated on the inner surface of successive convolutions so as the web 184 is payed off of the reel 186 and about a guide roller 196, the adhesive surface would be presented upwardly in the flight portion or run of the web 184 downstream from the guide roller 196. The cover web 188 is preferably of mylar or other similar transparent sheet materials which are impervious to the alkaline processing fluids used in the diffusion transfer processing of instant films. By virtue of its transparency, it need not be separated from the film sheet 74 after processing has been completed. The processing fluid pods 194 are conventional and, as such, are in the nature of elongated fluid impervious envelopes capable of being ruptured upon compression by passage through the nip of a processing roller pair.

Figure 12:
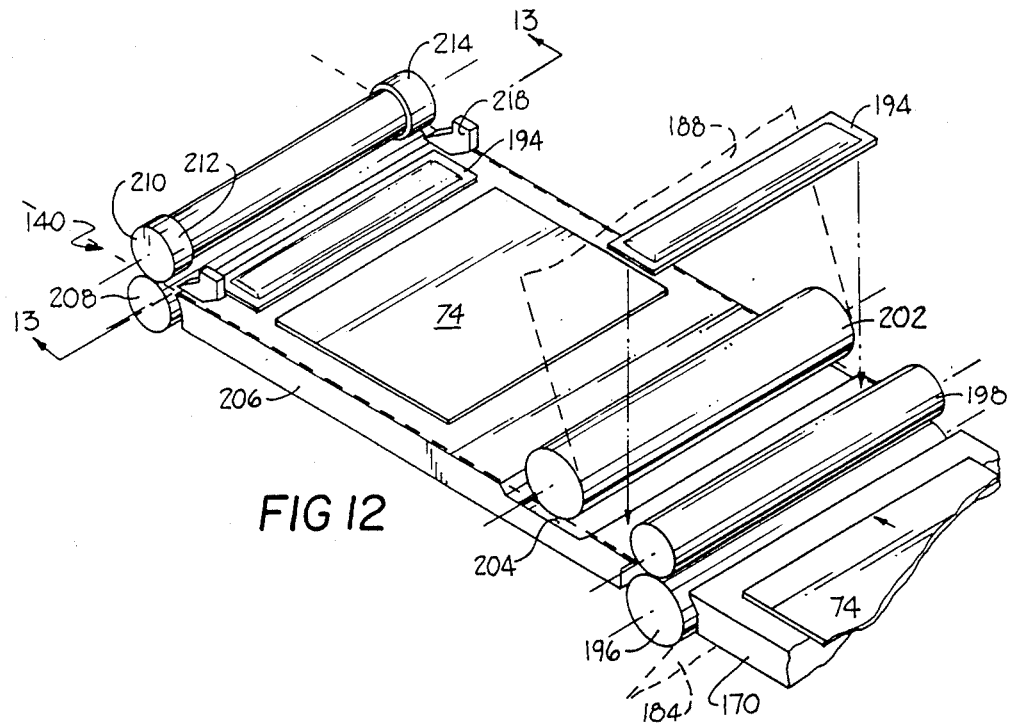
FIG. 12 is a perspective view illustrating processing components of the invention.
Figure 13:
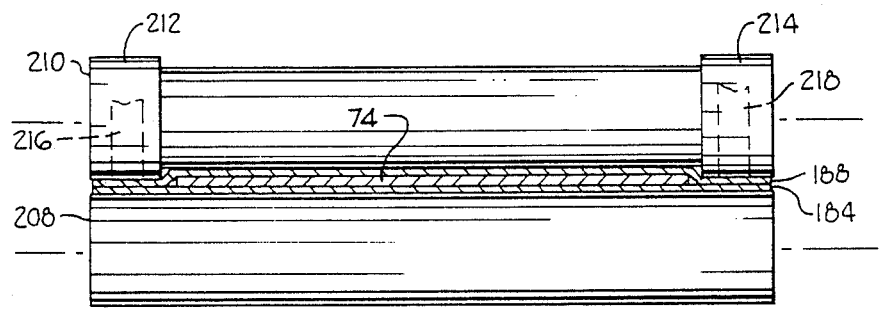
FIG. 13 is an enlarged cross-section on line 13—13 of FIG. 12.

As may be seen in FIGS. 8 and 12 of the drawings, the transport web 184 is stored in a wound manner about the idler roller 186 and upon reaching a horizontal tangent to the roller 196 passes under pressure roller 198. Roller 198 is of non-stick material, such as silicon-type plastics, to preclude pick-up of adhesive from the transport web 184. The rollers 196 and 198 thus define a pressure nip to which the film sheet 74 is advanced by the film sheet feed mechanism 136 upon separation from the carrier plate 72 in the manner described above. Because of the non-permanent adhesive on the web 184, the film sheet 74 will be temporarily secured in place on the top surface of the web 184 as it passes through the nip established by the rollers 196 and 198. The processing pods 194 are individually discharged from the tray 192 to an inclined chute 200 by which they are guided downwardly into position between the pressure roller 198 and an idler roller 202 for engagement with the adhesive of the transport web 184. The cover web 188 is trained from the supply reel 190 about the idler roll 202 and the spacing of the roller 202 from the roller 198 allows a short run of the transport web 184 to be presented upwardly for receipt of the individual processing pods 194. As shown in FIG. 12, the idler roller 202 overlies a shallow trough 204 in a guide-plate 206 along which the sandwiched assembly of a processing fluid pod and the exposed but yet unprocessed film sheet 74 are passed. The trough enables the processing pod 194 to be sandwiched between the webs 184 and 190 without rupture as it passes under the idler roller 202. Yet the relative positioning of the processing fluid pod in advance of a film sheet 74 is facilitated by synchronized deposition of a processing pod on the carrier web 184 in advance of a film sheet 74.

At the end of the guide-plate the sandwiched assembly of the transport web 184, the pod 194, the film sheet 74 and the cover web 190 are passed between the processing roller pair 140. The processing roller pair includes bottom and top rollers 208 and 210, respectively brought together under pressure to define a precise nip through which the sandwiched assembly of film and processing components are passed. As is well known in the art, the passage of the pod 194 through such a nip results in a rupture of the pod and in a uniform distribution of the fluid originally contained in the pod throughout the area of the emulsion on the film unit. The nip dimensions in the disclosed embodiment are established by cylindrical enlargements 212 and 214 on the top roller 210 to accurately establish the operative nip spacing between the rollers 208 and 210. To confine the processing fluid issuing from the pod 194 between the webs 190 and 192, guideshoes 216 and 218 are located upstream from the processing roller pair 140 to prevent leakage of processing fluid beyond the edges of the sheets 184 and 190.

After passage through the processing roller pair 140, the composite web is passed through the blanking mechanism 144 (see FIG. 8) in which a reciprocal punch 220 is provided for cutting the film sheet 74 and the sandwiching web components from the remainder of the composite web assembly. The processed and blanked film unit severed by the punch 220 is dropped into a chute 222 and then to the discharge bin 70. All spent processing materials other than the web portions remaining with the punched film sheet are passed to the spent processing material storage reel 144.

While the embodiment thus shown and described exemplifies the practice of the present invention, many variations of the disclosed embodiment are possible and contemplated. For example, the container means by which the exposed film units 54 are transferred to the processor 50 may be the receiver box 28 of the existing TEM machine to which a receiver box adapter 232 (FIGS. 14 and 15), similar to the adaptor 92, is connected after removal of the receiver box 28 from the TEM machine and prior to direct insertion of the thus modified receiver box into the well 64 of the processor.

Figure 14:
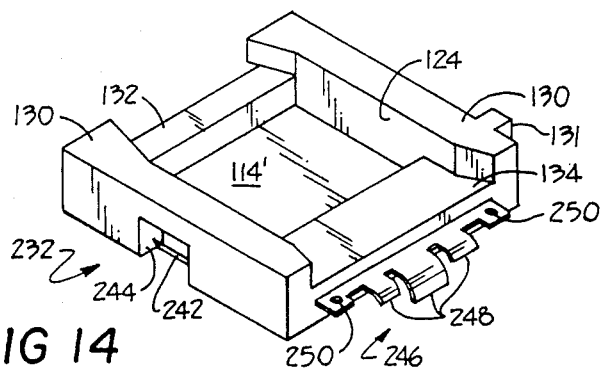
FIG. 14 is a perspective view illustrating the top surface of an adapter provided for existing TEM receiver boxes in an alternate form of the present invention.
Figure 15:
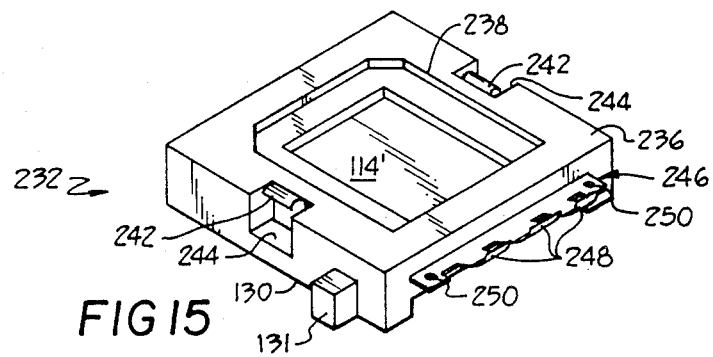
FIG. 15 is a perspective view illustrating the bottom surface of the adapter illustrated in FIG. 14.

FIG. 14 illustrates the upper side of the adapter 232 as viewed in an orientation for mounting on top of a TEM receiver box. Hence, the upper surfaces 130 and 132 are similar to those of adapter 92 shown in FIG. 5. However, in contrast to adapter 92, whose upper surfaces are configured to engage both the TEM receiver box and the processor 50, the upper side of the adapter 232, shown in FIG. 14, is made to conform to the processor 50 while the underside, shown in FIG. 15, is designed to conform to each type of TEM receiver box. Thus, the upper surfaces 130 and keying lug 131 as well as the processor slide feed surface 134 and film feed surface 132 are the same as that of adapter 92. The underside of the adapter (rather than being configured for mounting on the transfer box) are designed to mate with the receiver box. Thus, the bottom surface 236 (see FIG. 15) includes an opening 238 designed to accommodate the upper end of one type of TEM receiver box. The opening 238 terminates in a surface 240 configured to engage the top of the receiver box to support the adapter 232 thereon. A pair of clip members 242, located in indentations 244, are shown as an example of appropriate elements for engaging the clamp arrangement provided on one type of receiver box. Hence, like the adapters 92, each type of adapter 232 is provided with specific formations to enable lighttight fastening of the adapter to the receiver box.

Figure 1:
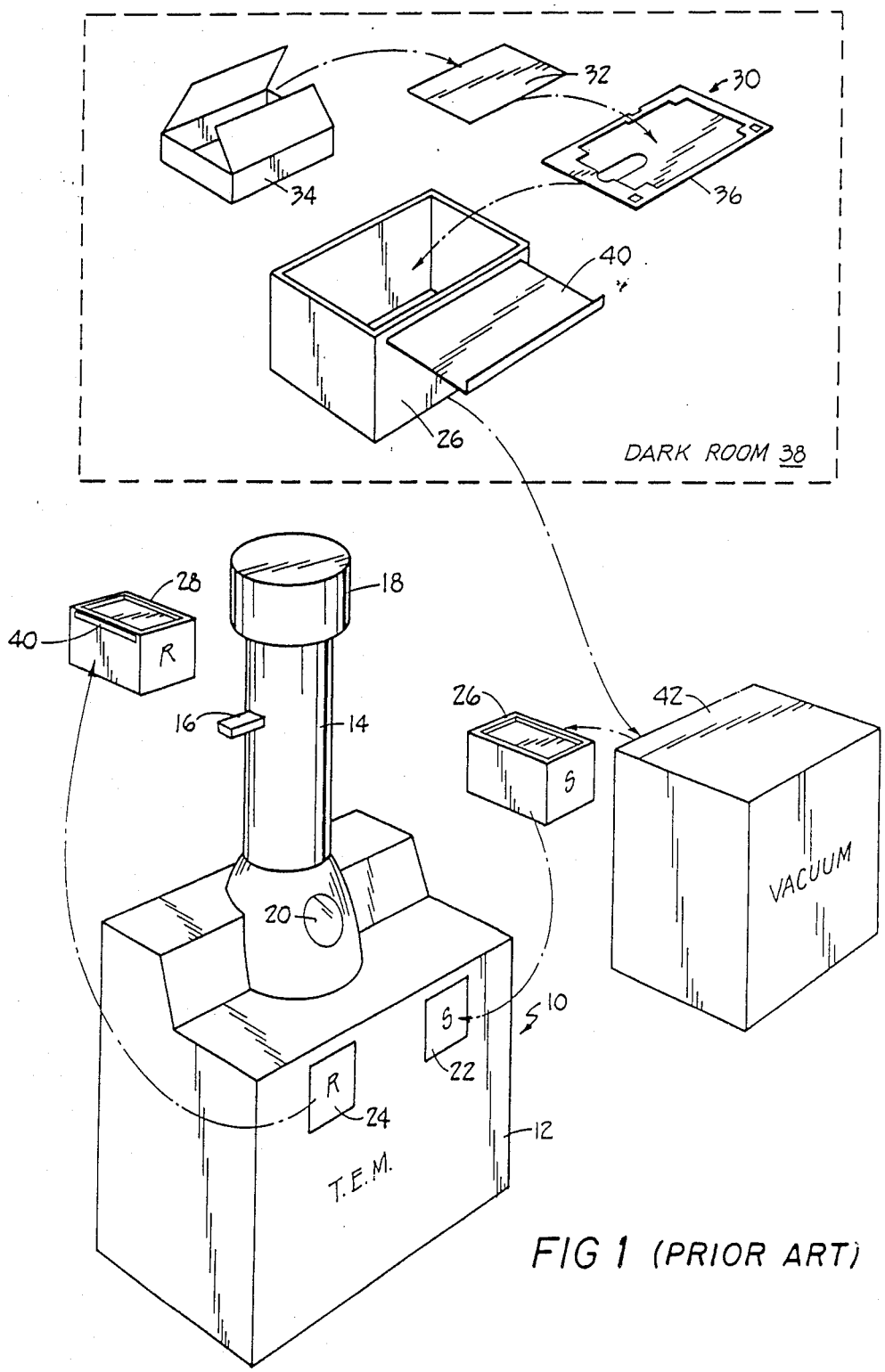
FIGS. 1 and 2, as above-mentioned, are largely schematic perspective views illustrating TEM film handling systems of the prior art.
Figure 2:
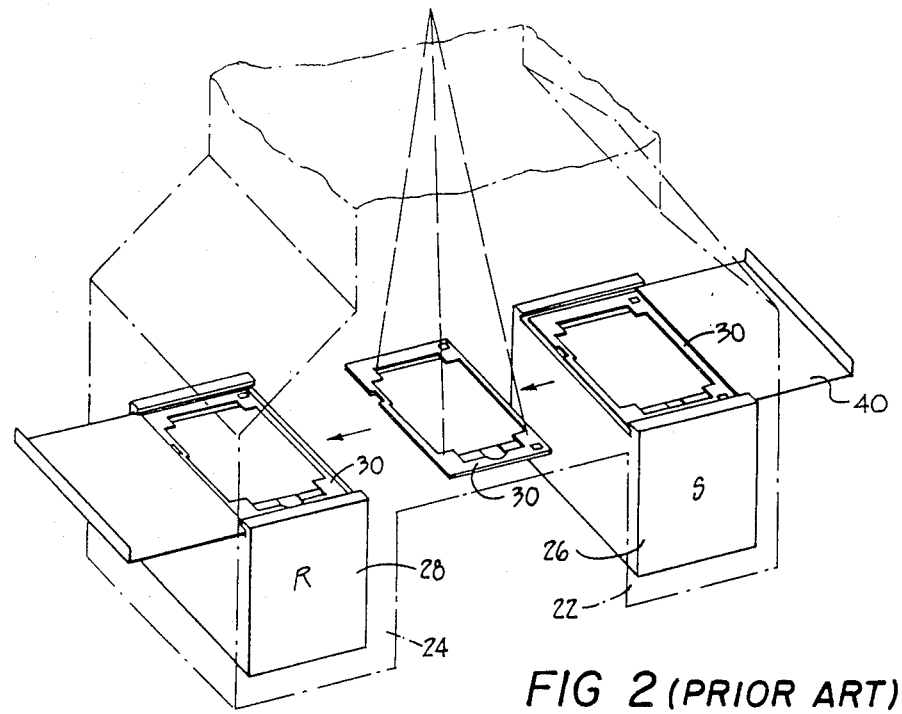

Similar to the adapter 92, the receiver box adapter 232 carries a dark slide 114'. The latter, however, terminates in an edge arrangement 246 having means, such as the bent tang arrangement 248, for engaging the upright lip of the receiver box dark slide (FIG. 1) so that the withdrawal of the adapter slide 114' (by the film processor) will also cause withdrawal of the receiver box slide. The tang arrangement 248 is, of course, provided for only one type of TEM receiver box, and hence would be varied to suit the particular box design. Alternatively, since the box includes a dark slide, the receiver box adapter need only provide a non-light blocking slide which engages the box slide and the processor. For enabling the engagement with the processor, the edge arrangement 246 carries a pair of spaced apertures 250 which are configured to seat on appropriate lugs (not shown) of the ejector slide 154 (FIGS. 10 and 11).

In use, the receiver box adapter 232 is placed upon and latched to a receiver box containing exposed film units. The assembly is then inverted and placed in the receiving well 64 of a processor 50 (FIG. 3) which is modified as noted below to accommodate a receiver box and adapter assembly rather than the transfer box arrangement previously described.

Following insertion in the well 64, the ejection slide 154 (modified to engage the slide edge arrangement 246) draws the receiver slide, or alternatively, the latter and the adapter slide 114', thereby allowing the stack of exposed film units 54 to drop into the adapter with the lowermost of the film units resting upon the rails 150 and 152 of the film processor.

This use of the receiver box places the film units in an upside-down orientation relative to the manner in which the film units are presented to the processor 50 by the transfer box 52. Hence, feed mechanism 136 would be modified to flip the film unit 54 over prior to its engagement with the surface 172 of the platform 170, and the resulting removal of the film sheet 74 from the carrier plate 72.

Thus, it will be appreciated that as a result of the present invention, a highly effective photographic apparatus for use in existing TEM machinery is provided and by which the stated objectives, among others, are completely fulfilled. It is equally apparent that modifications may be made in the embodiment illustrated and described herein without departure from the invention. It is expressly intended, therefore, that the foregoing description and accompanying drawings are illustrative of a preferred embodiment only, not limiting, and that the true spirit and scope of the present invention be determined by reference to the appended claims.

What is claimed is: pg,25

1. Photographic apparatus for use with a film unit having a carrier plate for retaining a film sheet in a flat condition, the carrier plate having aperture therein underlying a generally centrally located area of the film sheet, said apparatus comprising:

a platform having a nose member projecting upwardly therefrom;

feed means for first advancing the film unit to said platform to cause said nose member to enter the aperture in the carrier plate and flex the film sheet into a bow or arc extending along a given path; and means for engaging a bowed edge of the film sheet for advancing the bowed film sheet from the carrier plate along a path generally normal to the given path of the arc of the film sheet.

* * * * *